US011309515B2

(12) United States Patent
Park (10) Patent No.: US 11,309,515 B2
(45) Date of Patent: Apr. 19, 2022

(54) CONDUCTIVE FILM AND DISPLAY DEVICE COMPRISING THE SAME

(71) Applicant: LG Display Co., Ltd., Seoul (KR)

(72) Inventor: JongHyun Park, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/942,152

(22) Filed: Jul. 29, 2020

(65) Prior Publication Data

US 2021/0143359 A1    May 13, 2021

(30) Foreign Application Priority Data

Nov. 12, 2019   (KR) .......................... 10-2019-0144251

(51) Int. Cl.
*H01L 51/52*    (2006.01)
*G06F 3/041*    (2006.01)
*H01L 27/32*    (2006.01)

(52) U.S. Cl.
CPC .......... *H01L 51/5234* (2013.01); *G06F 3/041* (2013.01); *H01L 27/323* (2013.01); *H01L 27/3244* (2013.01); *H01L 51/5206* (2013.01)

(58) Field of Classification Search
CPC ..... G06F 3/041; G06F 3/0412; H01L 27/323; H01L 27/3244; H01L 51/0021; H01L 51/0037; H01L 51/5206; H01L 51/5234
See application file for complete search history.

(56) References Cited

U.S. PATENT DOCUMENTS

| 2010/0247870 | A1  | 9/2010 | Suzuki et al. |
| 2011/0193032 | A1* | 8/2011 | Shi ........................... H01B 1/16 252/519.21 |
| 2014/0106154 | A1  | 4/2014 | Kim et al. |
| 2015/0111048 | A1  | 4/2015 | Kim et al. |
| 2016/0108256 | A1* | 4/2016 | Yang ........................ G02B 1/16 428/220 |

FOREIGN PATENT DOCUMENTS

| CN | 102087885 A | 6/2011 |
| CN | 103730187 A | 4/2014 |
| CN | 104240798 A | 12/2014 |
| CN | 104575700 A | 4/2015 |
| CN | 106876600 A | 6/2017 |
| CN | 107610802 A | 1/2018 |
| JP | 2006-234788 A | 9/2006 |
| JP | 2011-014443 A | 1/2011 |
| JP | 2015-176668 A | 10/2015 |
| WO | 2009/054273 A1 | 4/2009 |

* cited by examiner

*Primary Examiner* — Afroza Chowdhury
(74) *Attorney, Agent, or Firm* — Seed IP Law Group LLP (57) ABSTRACT

The present disclosure relates to a conductive film and a display device including the conductive film. More specifically, as the conductive film includes a conductive polymer layer and a plurality of metal nanowires and includes a network structure inserted in the conductive polymer layer, it is possible to provide the conductive film with high light transmittance and excellent electrical conductivity and the display device including the conductive film.

15 Claims, 6 Drawing Sheets

CONDUCTIVE FILM AND DISPLAY DEVICE COMPRISING THE SAME

CROSS-REFERENCE TO RELATED APPLICATION

This application claims the priority benefit of Korean Patent Application No. 10-2019-0144251, filed on Nov. 12, 2019 in the Korean Intellectual Property Office, the disclosure of which is incorporated herein by reference in its entirety

BACKGROUND

Technical Field

The present disclosure relates to a conductive film and a display device including the conductive film. More specifically, the present disclosure relates to a conductive film that is transparent and flexible and has excellent electrical conductivity, and a display device including the conductive film.

DESCRIPTION OF THE RELATED ART

A transparent electrode is widely applied to a plasma display panel (PDP), an organic light emitting display (OLED) device, a liquid crystal display (LCD) device, a solar cell, a touch device, and the like. Typically, indium tin oxide (ITO) is used as a material of the transparent electrode. The ITO has an advantage of being transparent and having excellent electrical conductivity.

BRIEF SUMMARY

The ITO contains indium, which is a rare earth element with a small amount of reserves, there is therefore a problem that the price of indium is high due to the small amount of reserves. To address such an issue, for the purpose of replacing the ITO, the inventors have developed a conductive film having excellent conductivity by including a conductive polymer layer, and a network structure inserted in the conductive polymer layer and successfully applied the conductive film to a display device.

In accordance with one aspect of the present disclosure, provided are a conductive film having excellent conductivity and high light transmittance and a display device to which the conductive film is applied.

The conductive film according to embodiments of the present disclosure includes a base layer, a conductive polymer layer, and a network structure.

The conductive polymer layer is located on the base layer and includes a conductive polymer.

The network structure is inserted into the conductive polymer layer and includes a plurality of metal nanowires.

The display device according to embodiments of the present disclosure includes an electrode including the conductive film.

The present disclosure provides a conductive film that is transparent and flexible and has excellent electrical conductivity, and a display device including the conductive film.

In accordance with embodiments of the present disclosure, by the application of a conductive polymer layer and a network structure inserted in the conductive polymer layer, it is possible to provide a conductive film having excellent conductivity and high light transmittance.

In accordance with embodiments of the present disclosure, it is possible to replace the ITO by using the conductive film.

In accordance with embodiments of the present disclosure, by the application of an electrode including the conductive film, it is possible to provide a display device in which a high cost of the ITO can be replaced with the conductive film.

DETAILED DESCRIPTION

The advantages and features of the present disclosure and methods of achieving the same will be apparent by referring to embodiments of the present disclosure as described below in detail in conjunction with the accompanying drawings. However, the present disclosure is not limited to the embodiments set forth below, but may be implemented in various different forms. The following embodiments are provided only to completely disclose the present disclosure and inform those skilled in the art of the scope of the present disclosure.

In addition, the shapes, sizes, ratios, angles, numbers, and the like illustrated in the accompanying drawings for describing the embodiments of the present disclosure are merely examples, and the present disclosure is not limited thereto. Like reference numerals generally denote like elements throughout the present specification. Further, in the following description of the present disclosure, detailed description of well-known functions and configurations incorporated herein will be omitted when it is determined that the description may make the subject matter in some embodiments of the present disclosure rather unclear. The terms such as "including," "having," "containing," and "comprising of" used herein are generally intended to allow other components to be added unless the terms are used with the term "only." Singular forms used herein are intended to include plural forms unless the context clearly indicates otherwise.

In interpreting any elements or features of the embodiments of the present disclosure, it should be considered that any dimensions and relative sizes of layers, areas and regions include a tolerance or error range even when a specific description is not conducted.

Spatially relative terms, such as, "on," "over," "above," "below," "under," "beneath," "lower," "upper," "near," "close," "adjacent," and the like, may be used herein to describe one element or feature's relationship to another element(s) or feature(s) as illustrated in the figures, and it should be interpreted that one or more elements may be further "interposed" between the elements unless the terms such as "directly," "only" are used.

Time relative terms, such as "after," "subsequent to," "next to," "before," or the like, used herein to describe a temporal relationship between events, operations, or the like are generally intended to include events, situations, cases, operations, or the like that do not occur consecutively unless the terms, such as "directly," "immediately," or the like, are used.

When the terms, such as "first," "second," or the like, are used herein to describe various elements or components, it should be considered that these elements or components are not limited thereto. These terms are merely used herein for distinguishing an element from other elements. Therefore, a first element mentioned below may be a second element in a technical concept of the present disclosure.

The elements or features of various embodiments of the present disclosure can be partially or entirely bonded to or combined with each other and can be interlocked and operated in technically various ways as can be fully understood by a person having ordinary skill in the art, and the various embodiments can be carried out independently of or in association with each other.

Hereinafter, discussions will be conducted on various features or configurations of a conductive film according to embodiments of the present disclosure.

According to an embodiment of the conductive film, a conductive polymer may be a conjugated polymer of a cationic polymer and an anionic polymer.

According to an embodiment of the conductive film, the anionic polymer may be poly(3,4-ethylenedixoythiophene) (PEDOT).

According to an embodiment of the conductive film, the anionic polymer may be dextran sulfate.

According to an embodiment of the conductive film, a conductive polymer layer may have a sheet resistance of 20Ω/□ or less.

According to an embodiment of the conductive film, a conductive polymer layer may have a light transmittance of 85% or more.

According to an embodiment of the conductive film, a metal nanowire may be a silver nanowire.

According to an embodiment of the conductive film, the network structure may include a junction portion in which two adjacent metal nanowires of a plurality of metal nanowires contact each other.

According to an embodiment of the conductive film, the network structure may have a sheet resistance of 20Ω/□ or less.

According to an embodiment of the conductive film, the network structure may have a light transmittance of 90% or more.

According to an embodiment of the conductive film, the conductive polymer may be located in a pore between the plurality of metal nanowires forming the network structure.

Hereinafter, discussions will be conducted on various features or configurations of a display device according to embodiments of the present disclosure, with reference with the accompanying drawings.

According to an embodiment of the display device, the display device may include an organic light emitting element.

According to an embodiment of the display device, the organic light emitting element may include a first electrode, a light emitting layer, and a second electrode.

According to an embodiment of the display device, at least one of the first and second electrodes may include the conductive film described herein.

According to an embodiment of the display device, the display device may include a touch panel or a touch sensor including a plurality of touch electrodes.

According to an embodiment of the display device, one or more of the plurality of touch electrodes may include the conductive film described herein.

Hereinafter, with reference to the accompanying drawings, various embodiments of the present disclosure will be described in detail.

Figure 1:
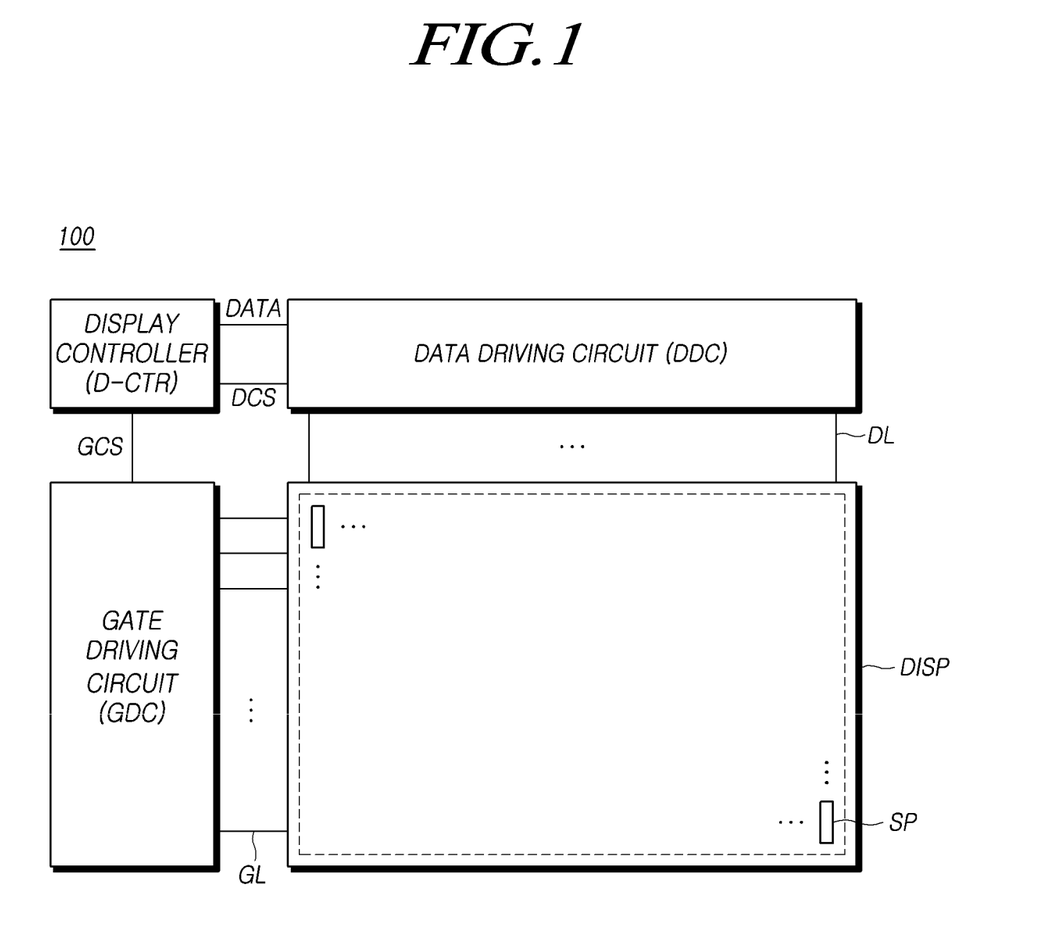
FIG. 1 illustrates a system configuration of a display device according to embodiments of the present disclosure.

FIG. 1 illustrates a system configuration of an electronic device 100 according to embodiments of the present disclosure.

Referring to FIG. 1, the display device 100 in accordance with embodiments of the present disclosure includes a display panel DISP in which a plurality of data lines DL and a plurality of gate lines GL are arranged and a plurality of sub-pixels SP adjacent to the plurality of data lines DL and the plurality of gate lines GL, a data driving circuit DDC (or a data driver) for driving the plurality of data lines DL, a gate driving circuit GDC (or a gate driver) for driving the plurality of gate lines GL, a controller D-CTR controlling the data driving circuit DDC and the gate driving circuit GDC, and the like.

The controller D-CTR controls operations of the data driving circuit DDC and the gate driving circuit GDC by supplying respective control signals (DCS, GCS) to the data driving circuit DDC and the gate driving circuit GDC.

The controller D-CTR starts a scan of pixels according to timings processed in each frame, converts image data inputted from other devices or other image providing sources to be adapted to a data signal form used in the data driving circuit DDC and then outputs image data DATA resulted from the converting, and causes the data to be loaded into the pixels at a pre-configured time according to the scan.

The controller D-CTR may be implemented as a separate component from the data driving circuit DDC or may be integrated with data driving circuit DDC so the controller D-CTR can be implemented as an integrated circuit.

The data driving circuit DDC drives the plurality of data lines DL by providing data voltages corresponding to image data DATA received from the controller D-CTR to the data lines DL. Here, the data driving circuit DDC is sometimes referred to as a source driving circuit or a source driver.

The data driving circuit DDC may include at least one source driver integrated circuit SDIC to be implemented.

Each source driver integrated circuit SDIC may include a shift register, a latch circuit, a digital to analog converter DAC, an output buffer, and/or the like.

In some instances, each source driver integrated circuit SDIC may further include one or more analog to digital converters ADC.

The gate driving circuit GDC sequentially drives a plurality of gate lines GL by sequentially providing scan signals to the plurality of gate lines GL. Here, the gate driving circuit GDC is sometimes referred to as a scan driving circuit or a scan driver.

The gate driving circuit GDC may include at least one gate driver integrated circuit GDIC to be implemented.

Each gate driver integrated circuit GDIC may include a shift register, a level shifter, and/or the like.

Each gate driver integrated circuit GDIC may be connected to a pad, such as a bonding pad, of the display panel DISP in a tape automated bonding (TAB) type or a chip on glass (COG) type, or be directly disposed on the display panel DISP in a gate in panel (GIP) type. In some instances, the gate driver integrated circuit GDIC may be disposed to be integrated with the display panel DISP. Further, each gate driver integrated circuit GDIC may be implemented in a chip on film (COF) type in which the gate driver integrated circuit GDIC is mounted on a film connected with the display panel DISP.

According to the controlling of the controller D-CTR, the gate driving circuit GDC sequentially provides scan signals of an on-voltage or an off-voltage to the plurality of gate lines GL.

When a specific gate line is asserted by a scan signal from the gate driving circuit GDC, the data driving circuit DDC converts image data DATA received from the controller D-CTR into analog data voltages and provides the obtained analog data voltages to the plurality of data lines DL.

The data driving circuit DDC may be located on, but not limited to, only one side (e.g., an upper side or a lower side) of the display panel DISP, or in some instances, be located on, but not limited to, two sides (e.g., the upper side and the lower side) of the display panel DISP according to driving schemes, panel design schemes, or the like.

The gate driving circuit GDC may be located on, but not limited to, only one side (e.g., a left side or a right side) of the panel DISP, or in some instances, be located on, but not limited to, two sides (e.g., the left side and the right side) of the display panel DISP according to driving schemes, panel design schemes, or the like.

The display device 100 according to embodiments of the present disclosure may be one of various types of display devices, such as, a liquid crystal display device, an organic light emitting display device, a plasma display device, or the like.

In case the display device 100 according to embodiments of the present disclosure is an organic light emitting display device, each sub-pixel SP arranged in the display panel DISP may include circuit elements, such as an organic light emitting diode (OLED), which is a self-emissive element, a driving transistor for driving the OLED, and the like.

Types of circuit elements and the number of the circuit elements included in each subpixel SP may be different depending on types of panels (e.g., an LCD panel, an OLED panel, etc.), provided functions, design schemes/features, or the like.

Hereinafter, a sub-pixel structure (a sub-pixel circuit) in a display panel for displaying images using an organic light emitting element ("OLED") will be described in detail with reference to accompanying drawings.

Figure 2:
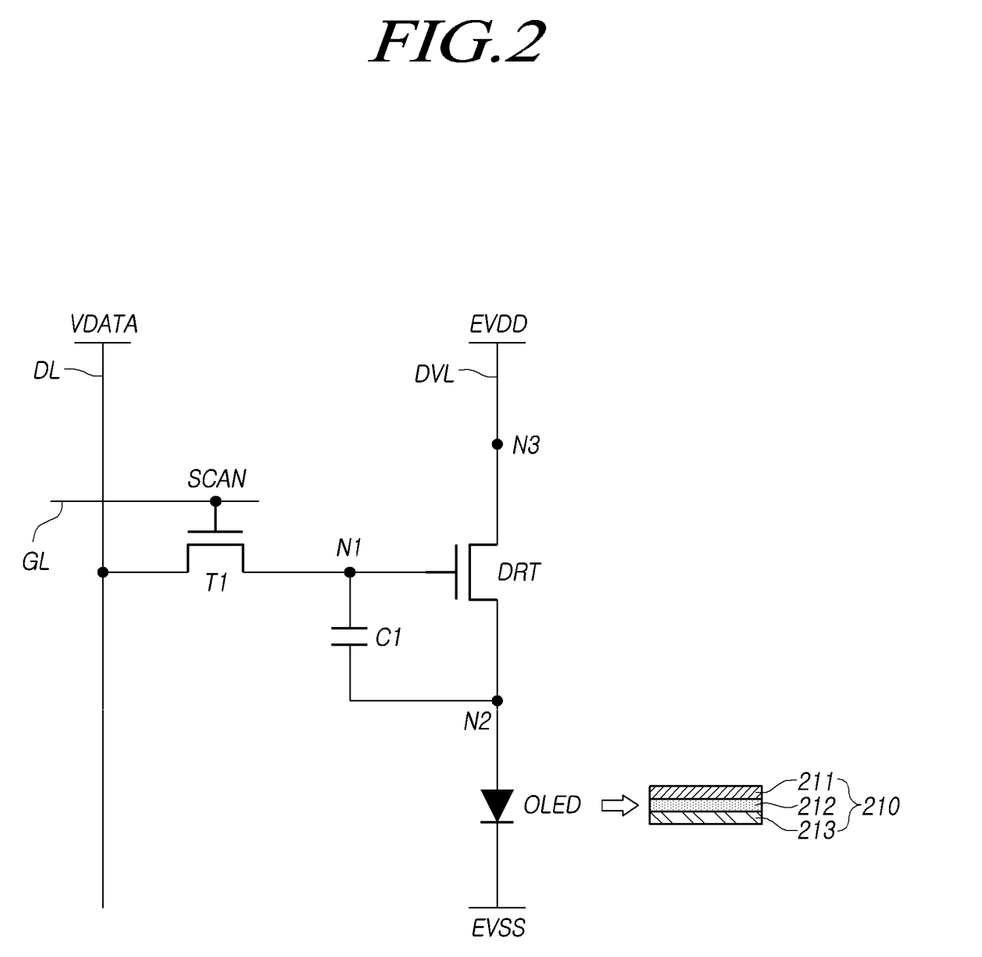
FIGS. 2 and 3 illustrate a sub-pixel circuit of a display panel according to embodiments of the present disclosure.
Figure 3:
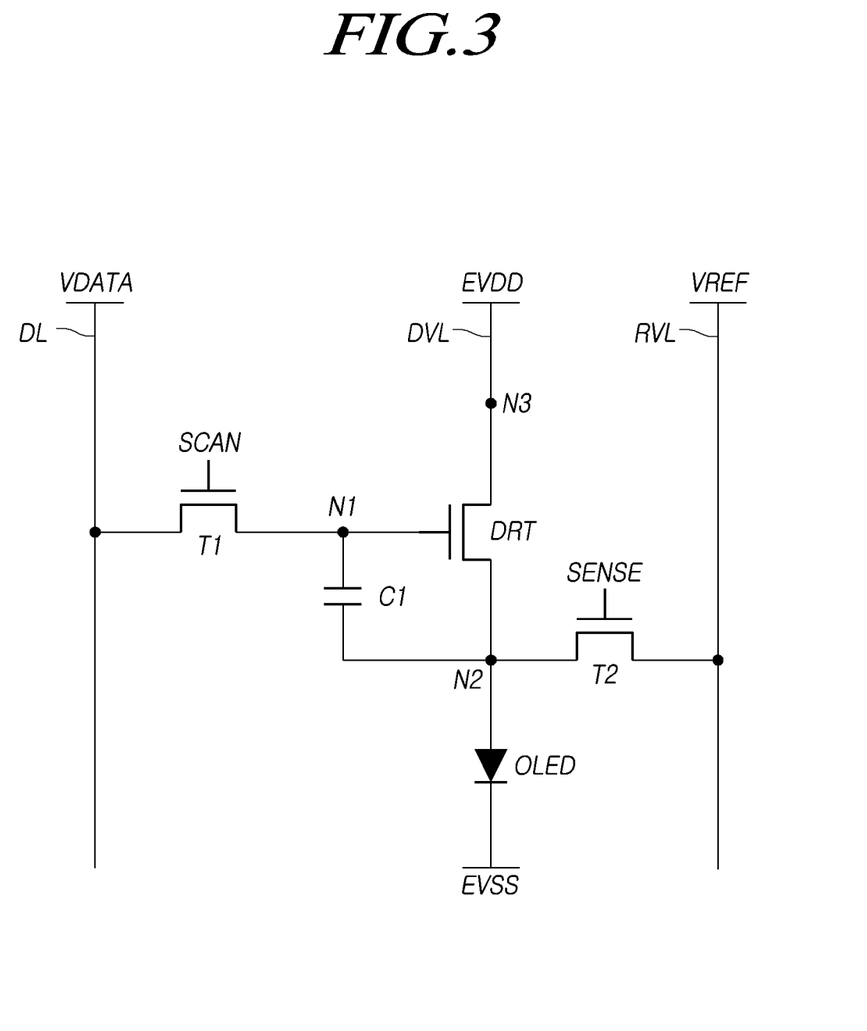

FIGS. 2 and 3 illustrate a sub-pixel circuit of a display panel according to embodiments of the present disclosure.

Referring to FIGS. 2 and 3, each subpixel SP may include an OLED and a driving transistor DRT for driving the OLED 210, as a basic element.

Referring to FIG. 2, each sub-pixel SP may further include a first transistor T1 allowing a data voltage VDATA to be supplied to a first node N1 corresponding to a gate node of the driving transistor DRT, and a storage capacitor C1 for remaining a data voltage VDATA corresponding to an image signal voltage or a voltage corresponding to this during one frame time.

The OLED may include a first electrode E1 (e.g., an anode electrode or a cathode electrode), a light emitting layer 212, a second electrode E2 (e.g., the cathode electrode or the anode electrode), and the like.

In one embodiment, a low-level voltage EVSS may be applied to the second electrode 213 of the OLED The driving transistor DRT causes the OLED to be driven by providing a driving current to the OLED.

The driving transistor DRT includes a first node N1, a second node N2 and a third node N3.

The first node N1 of the driving transistor DRT may be a node corresponding to the gate node thereof, and may be electrically connected to a source node or a drain node of the first transistor T1.

The second node N2 of the driving transistor DRT may be electrically connected to the first electrode 211 of the OLED and may be a source node or a drain node.

The third node N3 of the driving transistor DRT may be the drain node or the source node as a node to which a driving voltage EVDD is applied, and may be electrically connected to a driving voltage line DVL used to supply a driving voltage EVDD.

The driving transistor DRT and the first transistor T1 may be n-type transistors or p-type transistors.

The first transistor T1 may be electrically connected between a data line DL and the first node of the driving transistor DL and may be controlled by a scan signal SCAN1 that is delivered through a gate line GL and applied to the gate node N1 of the first transistor T1.

The first transistor T1 may be turned on by the scan signal SCAN and allow a data voltage VDATA supplied through the data line DL to be supplied to the first node N1 of the driving transistor DRT.

The storage capacitor C1 may be electrically connected between the first node N1 and the second node N2 of the driving transistor DRT.

The storage capacitor C1 is an external capacitor intentionally designed to be located outside of the driving transistor DRT, not an internal storage, such as a parasitic capacitor (e.g., a Cgs, a Cgd) that presents between the first node N1 and the second node N2 of the driving transistor DRT.

Referring to FIG. 3, each sub-pixel SP arranged in the display panel in accordance with embodiments of the present disclosure may further include a second transistor T2 in addition to the OLED, the driving transistor DRT, the first transistor T1, and the storage capacitor C1.

The second transistor T2 may be electrically connected between the second node N2 of the driving transistor DRT and a reference voltage line RVL used to supply a reference voltage VREF, and may be controlled by a sensing signal SENSE applied to the gate node of the second transistor T2, which is a type of the scan signal.

The additional inclusion of the second transistor T2 leads a voltage of the second node N2 of the driving transistor DRT included in the sub-pixel SP to be controlled effectively.

The second transistor T2 is turned on by the scan signal SENSE and allows a reference voltage VREF supplied through the reference voltage line RVL to be applied to the second node N2 of the driving transistor DRT.

The sub-pixel structure illustrated in FIG. 3 is advantageous in accurately initializing a voltage in the second node N2 of the driving transistor DRT and in sensing an intrinsic characteristic value (e.g., threshold voltage or mobility) of the driving transistor DRT and an intrinsic characteristic value (e.g., threshold voltage) of the OLED.

Meanwhile, the scan signal SCAN and the sensing signal SENSE may be separate gate signals. In this case, the scan signal SCAN and the sensing signal SENSE respectively may be applied to the gate node of the first transistor T1 and the gate node of the second transistor T2 through different gate lines.

In some instances, the scan signal SCAN and the sensing signal SENSE may be the same gate signal. In this case, the scan signal SCAN and the sensing signal SENSE may be commonly applied to the gate node of the first transistor T1 and the gate node of the second transistor T2 through the same gate line.

Figure 4:
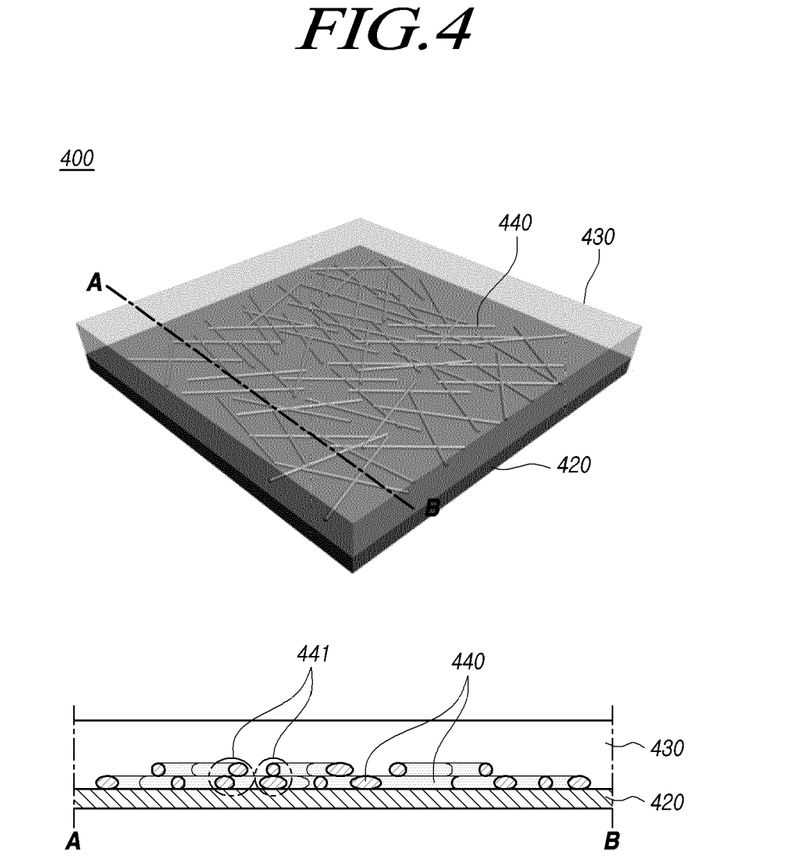
FIG. 4 illustrates a conductive film according to embodiments of the present disclosure.

FIG. 4 illustrates a conductive film according to embodiments of the present disclosure.

Referring to FIG. 4, the conductive film 400 includes a base layer 420 such as a substrate etc., a conductive polymer layer 430, and a network structure 440.

The base layer 420 is a layer forming a base of the conductive film 400. The base layer 420 may include, for example, one or more of polyimide PI, polycarbonate PC, polyethylene terephthalate PET, and silicon wafer.

In one embodiment, since the polyimide is light, flexible, and excellent in heat resistance, impact resistance and abrasion resistance, the base layer 420 may include the polyimide PI.

The conductive polymer layer 430 is disposed on the base layer 420. Further, the conductive polymer layer 430 includes a conductive polymer.

The conductive polymer means a polymer with excellent conductivity and is not limited to a specific type as long as a sheet resistance thereof is 60Ω/□ or less.

The conductive polymer may be a conjugated polymer of an anionic polymer and a cationic polymer. When the conductive polymer is the conjugated polymer of the anionic polymer and the cationic polymer, the conductive polymer layer including the conductive polymer can have a low sheet resistance and excellent conductivity.

The anionic polymer may be a polymer enabling the conductive polymer to have excellent conductivity. For example, the anionic polymer may be poly(3,4-ethylenedioxythiophene) (PEDOT).

The cationic polymer may be a polymer enabling the conductive polymer to have excellent conductivity. For example, the cationic polymer may be dextran sulfate (DS).

In case the PEDOT and the DS are used as the cationic polymer and the anionic polymer, respectively, the conductive polymer may have both excellent conductivity and high light transmittance.

The conductive polymer may have, for example, a conductivity of 9000 S/cm (Siemens per centimeter) or more. Since the higher conductivity is, the better the conductivity of the conductive film is, an upper limit of the conductivity of the conductive polymer may not be limited to a specific value. For example, the upper limit of the conductivity of the conductive polymer may be 20000 S/cm or less. In case the conductive polymer has conductivity within the above range of values, the conductive film can have excellent conductivity, and luminance and power efficiency of the display device can be improved.

The conductive polymer may have a light transmittance of 85% or more for light with a wavelength of 550 nm. A lower limit of the light transmittance may be, for example, 87% or more or 90% or more. Since the higher the light transmittance of the conductive polymer is, the higher the transparency of the conductive film is, an upper limit of the light transmittance may not be limited to a specific value. For example, the upper limit of the light transmittance may be 99% or less or 95% or less. In case the conductive polymer has light transparency within the above range of values, the conductive film can have excellent transparency, and luminance and power efficiency of the display device can be improved.

A network structure 440 may be inserted in the conductive polymer layer 430. In one or more embodiments, the network structure 440 is comprised of a plurality of overlapping highly conductive structures. In some embodiments, the highly conductive structures includes metallic structures and in a preferred embodiment, each highly conductive structure is a metal nanowire. The metallic structures have dimensions on the order of a nanometer in width and dozens nanometers or in some instances in the range of 100 nanometers in length. A structure that is highly conductive has a conductivity in the general range of $6.0 \times 10^7$ to $6.0 \times 10^6$ and includes highly conductive metals such as silver, gold, copper, aluminum, zinc, nickel, tin and the like. The network structure 440 has a higher conductivity than the conductive polymer included in the conductive polymer layer 430, leading the conductive film to have high conductivity. The network structure 440 may include various shapes, arrangements and alignments of the plurality of highly conductive structures. In some embodiments, each of the highly conductive structures are discrete from each other. In some embodiments, at least one of the highly conductive structure overlaps with at least one other conductive structure. In a preferred embodiment, each highly conductive structure will overlap with at least one other highly conductive structure in the majority of the area of the conductive film 400, thus creating a highly conductive network 440.

As illustrated in FIG. 4, the network structure 440 may include a plurality of metal nanowires. The network structure 440 including the plurality of metal nanowires may include a junction portion 441 in which two adjacent metal nanowires contact each other. In case a sufficient number of metal nanowires are disposed on the base layer 420, adjacent metal nanowires are located to be overlapped, and/or to contact, each other to form the junction portion 441. The junction portion 441 may referred to as a portion in which two or more adjacent metal nanowires contact each other.

Since the network structure 440 includes the junction portion 441, a path allowing a current to flow through the metal nanowires and the junction portion 441 can be formed, thus, leading a current to flow across the entire network structure through the metal nanowires and the junction portion 441. Accordingly, electrical conductivity of the conductive film 400 including the network structure 440 can be dramatically improved.

Types of the metal nanowires may be, for example, a silver nanowire, a gold nanowire, or a platinum nanowire. Among these metals, since the silver has excellent conductivity and is easy to make in a wire form, the metal nanowire(s) according to the embodiments of the present disclosure may be silver nanowire(s).

Since the silver nanowire has a resistance value of 80Ω to 120Ω, which is lower than ITO having a resistance value of 200Ω to 400Ω, it is advantageous for a large size. Further, since a printing method, not deposition, can be applied and a curved surface can be implemented, the silver nanowire is also applicable to a flexible display device.

The silver nanowire may have a diameter of 10 nm to 100 nm and a length of 1 μm to 100 μm. Accordingly, since the silver nanowire has a very large diameter-length ratio, even when a small amount of silver nanowire is used, adjacent silver nanowires may contact each other, form the junction portion 441, and thereby form the network structure 440. In case the silver nanowires form the network structure 440, due to pores located between silver nanowires and a size in dimensions of the order of a nanometer of the silver nanowires, the network structure 440 can have a high light transmittance.

Figure 5:
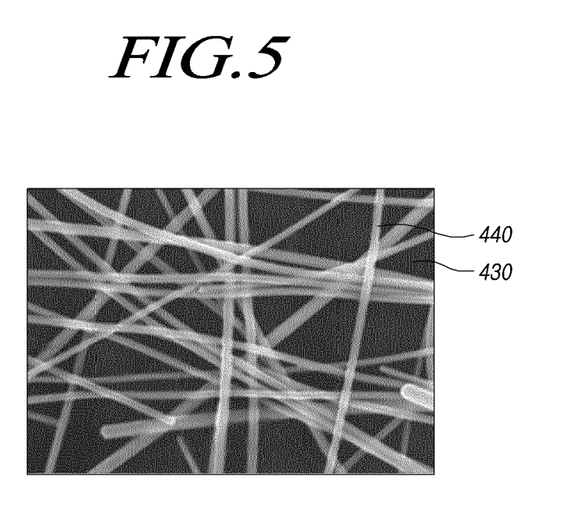
FIG. 5 illustrates a conductive polymer layer and a network structure of the conductive film according to embodiments of the present disclosure.

FIG. 5 illustrates a conductive polymer layer 430 and a network structure 440 of the conductive film according to embodiments of the present disclosure.

As described above, the network structure 440 including metal nanowires has a porosity characteristic including pores located between metal nanowires. Such a porosity characteristic has advantages, such as an excellent light transmittance, a flexible characteristics, and the like, but also has a problem of a decrease in conductivity and an increase in resistance. The pores of the network structure 440 are filled with the conductive polymer included in the conductive polymer layer 430. Accordingly, the conductive polymer may be located in pores between the plurality of metal nanowires forming the network structure 440. When the conductive polymer fills the pore of the network structure 440, weak mechanical properties of the network structure 440 may be supplemented, and the conductive film can have excellent hardness, scratch resistance, and durability.

In accordance with embodiments of the present disclosure, a conductive polymer may be a conjugated polymer of an anionic polymer and a cationic polymer, and include the PEDOT as the anionic polymer and the DS as the cationic polymer. Such a conductive polymer may be polymerized by vapor polymerization. When the conductive polymer is polymerized by the vapor polymerization, since the pores of a network structure 440 can be effectively filled, and in the process of filling the pores of the network structure 440, the connection of a junction portion 441 in which adjacent metal nanowires contact each other can be maximally prevented from being disconnected, it is possible to form the network structure 440 with excellent conductivity.

The network structure 440 may have a low sheet resistance. For example, the network structure 440 may have a sheet resistance of 20Ω/□ (ohms per square) or less. Since the lower the sheet resistance is, the better the conductivity of a conductive film is, a lower limit of the sheet resistance of the network structure 440 may not be limited to a specific value. For example, the lower limit of the sheet resistance of the network structure 440 may be 1Ω/□ or more or 5Ω/□ or more. Since the network structure 440 has a low sheet resistance, the conductive film can have excellent conductivity and therefore, effectively replace the ITO.

The network structure 440 may have a high light transmittance. For example, the network structure 440 may have a light transmittance of 90% or more for light with a wavelength of 550 nm. Since the higher the light transmittance is, the better the transparency of the conductive film is, an upper limit of the light transmittance of the network structure 440 may not be limited to a specific value. For example, the upper limit of the light transmittance of the network structure 440 may be 99% or less or 95% or less. Since the network structure 440 has a high transmittance, the conductive film can have excellent transparency and therefore, effectively replace the ITO.

As described above, since the conductive film in accordance with embodiments of the present disclosure has excellent light transmittance, electrical conductivity, and flexibility, thus, the conductive film can be applied to touch panels included several types of electronic devices, and be used as a transparent electrode of flexible display devices.

The display device in accordance with embodiments of the present disclosure may include a touch panel in which a plurality of touch electrodes is arranged, a touch sensing circuit for performing the driving and sensing processes of the touch panel, and the like, as a touch sensor for touch sensing. In case the touch panel is an embedded type, the touch panel may be a collection of a plurality of touch electrodes. Here, a plate or a layer on which the plurality of touch electrodes is arranged may be a dedicated substrate, or a layer (e.g., an encapsulation layer) disposed in the display panel. The plurality of touch electrodes and the touch sensing circuit included in the touch panel may include the conductive film as described above in accordance with the embodiments of the present disclosure.

Figure 6:
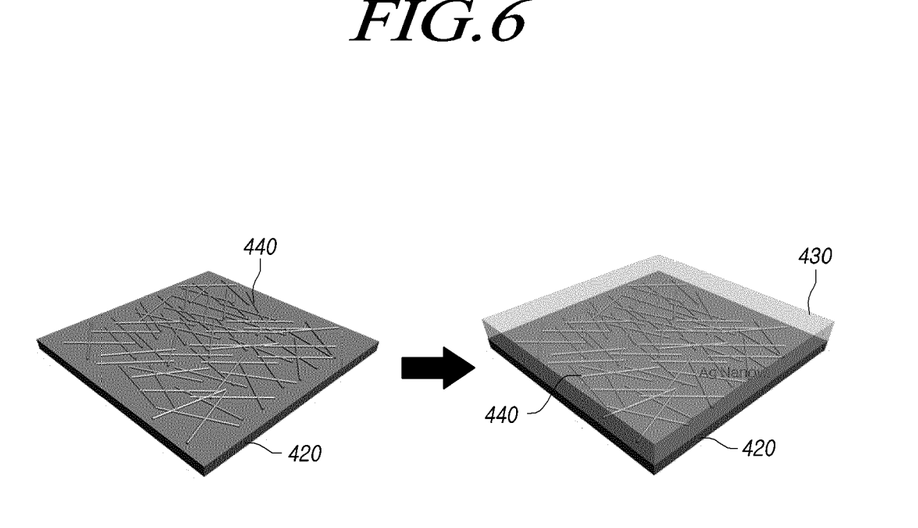
FIG. 6 illustrates a method of manufacturing the conductive film according to embodiments of the present disclosure.

FIG. 6 illustrates a method of manufacturing the conductive film according to embodiments of the present disclosure.

In describing embodiments related to methods of manufacturing the conductive film, descriptions of the same or corresponding elements or configurations as the embodiment described above will not be repeatedly performed. Hereinafter, the method of manufacturing the conductive film in accordance with embodiments of the present disclosure will be discussed.

Referring to FIG. 6, the method of manufacturing the conductive film may include a step of forming a network structure 440 including metal nanowires on a base layer 420.

The process of forming the network structure 440 on the base layer 420 may be, for example, a method in which silver nanowires are synthesized in a polyol solution phase process in the air, and then coated on the base layer 420 by using a printing process and a spray process. However, methods of coating solution including metal nanowires on the base layer 420 are not limited to a specific method.

The specific shape of the network structure 440 may be adjusted by adjusting the content of silver nanowires coated on the base layer 420. Since the higher the content of silver nanowires is, the greater the number of junction portions 441 included in the network structure 440 is, the network structure can have a lower sheet resistance.

The method of manufacturing the conductive film in accordance with embodiments of the present disclosure may include a step of forming a conductive polymer layer 430. The step of forming the conductive polymer layer 430 may be performed by a method in which after the network structure 440 is formed, the conductive polymer layer 430 is formed by performing vapor polymerization for a conductive polymer included in the conductive polymer layer 430.

The conductive polymer formed by the vapor polymerization may be, for example, PEDOT:DS, which is a conjugated polymer including poly(3,4-ethylenedixoythiophene) (PEDOT) as the anionic polymer and dextran sulfate (DS) as the cationic polymer. When the PEDOT:DS is used as a conductive polymer, the vapor polymerization can be easily used, and the conductive polymer can have excellent conductivity.

When forming the conductive polymer layer through vapor polymerization on the substrate or the base layer 420 on which the network structure 440 including metal nanowires is formed, a connection in a junction portion of network structure 440 may be more effectively prevented from being disconnected, compared with the forming of the conductive polymer layer through solution polymerization, or the like. Further, it is possible for the conductive polymer effectively to fill pores located between metal nanowires forming network structure 440. When the conductive polymer fills the pores in the network structure 440, since a cross junction resistance can be decreased, the conductive film can have a low sheet resistance and excellent conductivity.

Some embodiments of the present disclosure relates to a display device.

In describing embodiments related to the method of manufacturing the conductive film, descriptions of the same or corresponding elements or configurations as the embodiment described above will not be repeatedly performed.

Hereinafter, the method of manufacturing a conductive film in accordance with embodiments of the present disclosure will be discussed.

The display device according to embodiments of the present disclosure includes an electrode including the conductive film. This conductive film is substantially equal to the conductive film in accordance with the embodiments of the present disclosure described above. Since the display device includes an electrode including the conductive film, the ITO can be replaced by the conductive film, or the number or an entire size of ITO electrodes used can be reduced.

The electrode may be, for example, an electrode included in an organic light emitting element of the display device. The display device may include the organic light emitting element, and the organic light emitting element may include a first electrode, a light emitting layer, and a second electrode. The first electrode may be an anode electrode or a cathode electrode, and the second electrode may be the cathode electrode or the anode electrode. The electrode including the conductive film may be used as an electrode to which high transparency and excellent electrical conductivity are required among the first and second electrodes of the organic light emitting element.

The above description has been presented to enable any person skilled in the art to make and use the invention, and has been provided in the context of a particular application and its requirements. Various modifications, additions and substitutions to the described embodiments will be readily apparent to those skilled in the art, and the general principles defined herein may be applied to other embodiments and applications without departing from the spirit and scope of the present invention. Although the embodiments have been described for illustrative purposes, a person skilled in the art will appreciate that various modifications and applications are possible without departing from the essential characteristics of the present disclosure. For example, the specific components of the embodiments may be variously modified. The above description and the accompanying drawings provide an example of the technical idea of the present invention for illustrative purposes only. That is, the disclosed embodiments are intended to illustrate the scope of the technical idea of the present disclosure. Thus, the scope of the present disclosure is not limited to the embodiments shown, but is to be accorded the widest scope consistent with the claims. The scope of protection of the present disclosure is to be construed according to the claims, and all technical ideas within the scope of the claims should be interpreted as being included in the scope of the present invention.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A conductive film, comprising:
   a base layer;
   a conductive polymer layer on the base layer and including a conductive polymer; and
   a network structure positioned within the conductive polymer layer,
   wherein the network structure includes a plurality of metal nanowires,
   wherein the conductive polymer is a conjugated polymer of an anionic polymer and a cationic polymer, and
   wherein the cationic polymer includes dextran sulfate.

2. The conductive film according to claim 1, wherein the anionic polymer includes poly(3,4-ethylenedixoythiophene).

3. The conductive film according to claim 1, wherein the conductive polymer has a conductivity of about 9000 S/cm (Siemens per centimeter) or more.

4. The conductive film according to claim 1, wherein the conductive polymer has a light transmittance of about 85% or more.

5. The conductive film according to claim 1, wherein the metal nanowires are silver nanowires.

6. The conductive film according to claim 1, wherein the network structure includes a junction portion in which two adjacent metal nanowires of a plurality of metal nanowires overlap each other.

7. The conductive film according to claim 1, wherein the network structure has a sheet resistance of 20Ω/□ (ohms per square) or less.

8. The conductive film according to claim 1, wherein the network structure has a light transmittance of about 90% or more.

9. The conductive film according to claim 1, wherein the conductive polymer is located in a pore between the plurality of metal nanowires forming the network structure.

10. A display device, comprising:
    a conductive film,
    the conductive film including:
    a base layer;
    a conductive polymer layer on the base layer and including a conductive polymer; and
    a plurality of overlapping metallic structures included in the conductive polymer layer, wherein the metallic structures have width dimensions on the order of a nanometer,
    wherein the conductive polymer is a conjugated polymer of an anionic polymer and a cationic polymer, and
    wherein the cationic polymer includes dextran sulfate.

11. The display device according to claim 10, wherein the display device further comprising an organic light emitting element,
    wherein the organic light emitting element includes a first electrode, a light emitting layer, and a second electrode, and
    wherein at least one of the first electrode and the second electrode include the conductive film.

12. The display device according to claim 10, wherein the display device further comprising a touch panel including a plurality of touch electrodes, and
    wherein at least one of the plurality of touch electrodes include the conductive film.

13. The display device according to claim 10, wherein each of the metallic structures are discrete from each other.

14. The display device according to claim 13, wherein at least one of the metallic structure overlaps with at least one other metallic structure in a majority of the area of network.

15. A conductive film, comprising:
    a base layer;
    a conductive polymer layer on the base layer and including a conductive polymer; and
    a network structure positioned within the conductive polymer layer, wherein the network structure includes a plurality of metal nanowires, and wherein the conductive polymer has a conductivity of about 9000 S/cm (Siemens per centimeter) or more.

* * * * *